(12) United States Patent
Jang

(10) Patent No.: US 6,496,000 B1
(45) Date of Patent: Dec. 17, 2002

(54) APPARATUS AND METHOD FOR TESTING MODULE DEVICES

(75) Inventor: Sung Hwan Jang, Kyounggi-do (KR)

(73) Assignee: Yuil Semicon Co., Ltd., Kyungki-do (KR)

( * ) Notice: Subject to any disclaimer, the term of this patent is extended or adjusted under 35 U.S.C. 154(b) by 20 days.

(21) Appl. No.: 09/661,059

(22) Filed: Sep. 13, 2000

(30) Foreign Application Priority Data

Feb. 12, 2000 (KR) .............................................. 00-6646

(51) Int. Cl.[7] .............................................. G01R 31/02
(52) U.S. Cl. ..................... 324/158.1; 324/754; 324/758; 324/761
(58) Field of Search ................................. 324/754, 758, 324/761, 765, 158.1, 72.5, 755; 209/571, 573; 206/571, 725, 724, 706; 29/701

(56) References Cited

U.S. PATENT DOCUMENTS

| | | | | |
|---|---|---|---|---|
| 5,093,984 A | * | 3/1992 | Lape | 29/741 |
| 6,218,852 B1 | * | 4/2001 | Smith | 324/761 |
| 6,226,188 B1 | * | 5/2001 | Warren | 361/802 |
| 6,329,831 B1 | * | 12/2001 | Bui | 324/765 |

* cited by examiner

*Primary Examiner*—Michael Sherry
*Assistant Examiner*—Trung Q. Nguyen
(74) *Attorney, Agent, or Firm*—Birch, Stewart, Kolasch & Birch, LLP

(57) ABSTRACT

A module device testing apparatus and method that is adaptive for testing a large number of module devices at the same time. In the apparatus and method, a plurality of module devices is entered into a high-temperature tunnel with at least two layers. A test of the module devices is performed within the high-temperature tunnel. The module devices having completed the high temperature test are derived from the high-temperature tunnel.

12 Claims, 9 Drawing Sheets

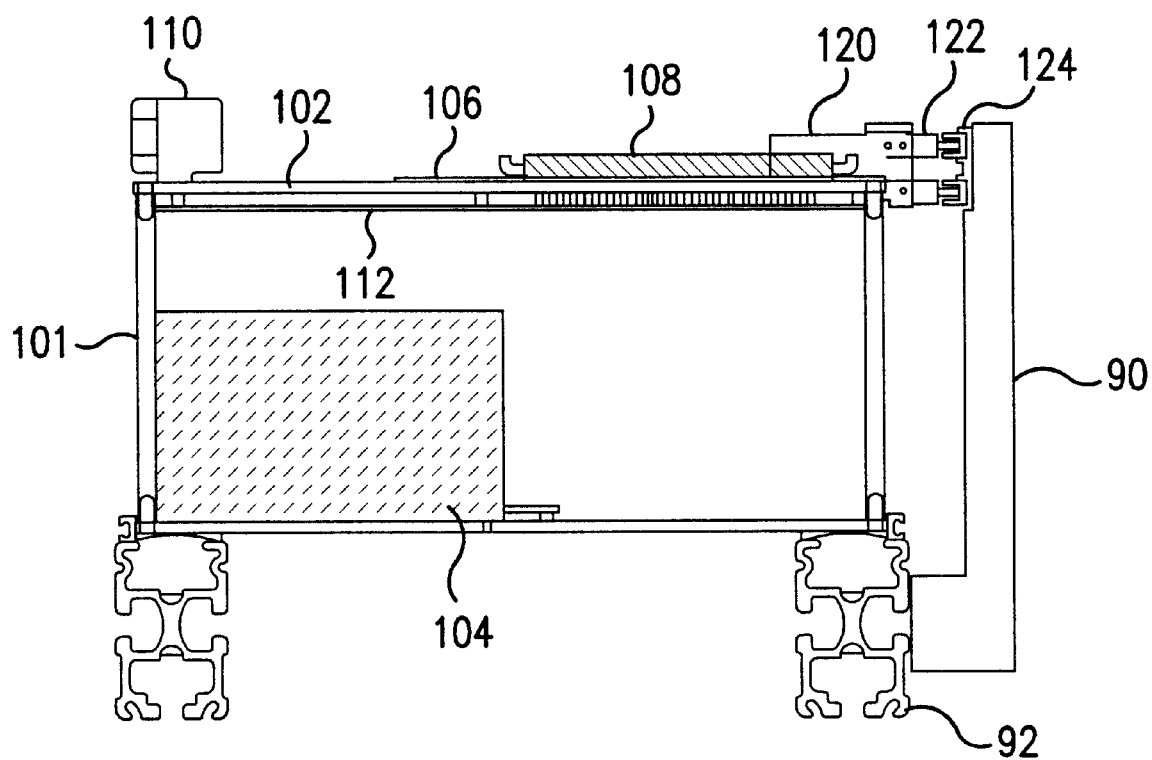

APPARATUS AND METHOD FOR TESTING MODULE DEVICES

BACKGROUND OF THE INVENTION

1. Field of the Invention

This invention relates to a technique of fabricating a module device in which various circuit devices are mounted on a print circuit board, and more particularly to a module device testing apparatus and method that is adaptive for testing a large number of module devices at the same time.

2. Description of the Related Art

Generally, a conventional module device is fabricated by carrying out a step of printing a wiring according to a circuit configuration on a print circuit board (PCB), a step of loading various circuit devices including a integrated circuit chip, such as a memory chip, on the PCB printed with the wiring, and a step of soldering various circuit devices loaded on the PCB in such a manner that the circuit devices are connected to the wiring. In the module devices fabricated in this manner, the circuit devices may not be loaded at a predetermined position and also a poor soldering may occur. For these reasons, the module device fabrication method requires a process of testing the module devices so as to judge whether or not any module devices are poor.

Referring to FIG. 1, the conventional module device testing apparatus includes a socket board 3 provided with a number of sockets 2, a test unit 4 provided with a loading head 6 to mount and release the socket board 3, and a test control box 5 mounted to and released from the test unit 4. Module devices 1 are mounted to or released from the sockets 2 on the socket board 3 with the aid of the loading head 6. If the module devices 1 are mounted to the sockets 2, then they are electrically connected, via the socket board 3, to a main board (not shown) within the test unit 4. Circuit and software for testing the module devices 1 are contained in the test control box 5. The test control box 5 is electrically connected, via a connector installed at the side surface of the test unit 4, to the main board. If the test control box 5 is mounted to the test unit 4 and an electric power is applied to the test control box 5, then a test is performed in accordance with various test parameters of the module device 1. Also, the test is performed within a high temperature chamber or a low temperature chamber so as to be aware of temperature characteristics of the module devices 1.

However, the conventional module device testing apparatus has a drawback in that it must use an expensive test control box 5, and has a problem in that, since the test is carried out at a single layer, the number of module devices 1 capable of being simultaneously tested is limited. In other words, in order to test a large number of module devices 1 at the same time, it is necessary to install a number of testing apparatus on the same plane. Since an area provided with the testing apparatus has a limit, however, the number of module devices 1 to be tested is limited.

SUMMARY OF THE INVENTION

Accordingly, it is an object of the present invention to provide an apparatus and method of testing module devices that is capable of simultaneously testing a large number of module devices.

In order to achieve these and other objects of the invention, a module device testing apparatus according to one aspect of the present invention includes a plurality of test units mounted with a plurality of module devices; a high-temperature tunnel with at least two layers; movement means, provided within the high-temperature tunnel, for moving the test units at the same layer and between layers within the high-temperature tunnel; and test means for testing a poor pattern and an electrical characteristic of the module devices progressing within the high-temperature tunnel.

A module device testing apparatus according to another aspect of the present invention includes a plurality of test units mounted with a plurality of module devices and provided with a tester for testing a poor pattern and an electrical characteristic of the module devices; a high-temperature tunnel with at least two layers; movement means, provided within the high-temperature tunnel, for moving the test units at the same layer and between layers within the high-temperature tunnel; module device loading means for locating the module devices at a loading position of the high-temperature tunnel; module device unloading means for deriving the module devices located at the loading position of the high-temperature tunnel; control means for controlling the movement means within the high-temperature tunnel, the module device loading means and the module device unloading means and for generating an identification information and a control signal of the test units; reading means for supplying the control means with a test result information from the test units; and recording means for recording a producer information of the module devices and the test result information to the module devices.

A module device testing method according to still another aspect of the present invention includes the steps of entering a plurality of module devices into a high-temperature tunnel with at least two layers; making a test of the module devices within the high-temperature tunnel; and deriving the module devices having completed the high temperature test from the high-temperature tunnel.

BRIEF DESCRIPTION OF THE DRAWINGS

These and other objects of the invention will be apparent from the following detailed-description of the embodiments of the present invention with reference to the accompanying drawings, in which:

FIG. 4C is a detailed side view of the test unit shown in FIG. 2; and

DETAILED DESCRIPTION OF THE PREFERRED EMBODIMENT

Figure 1:
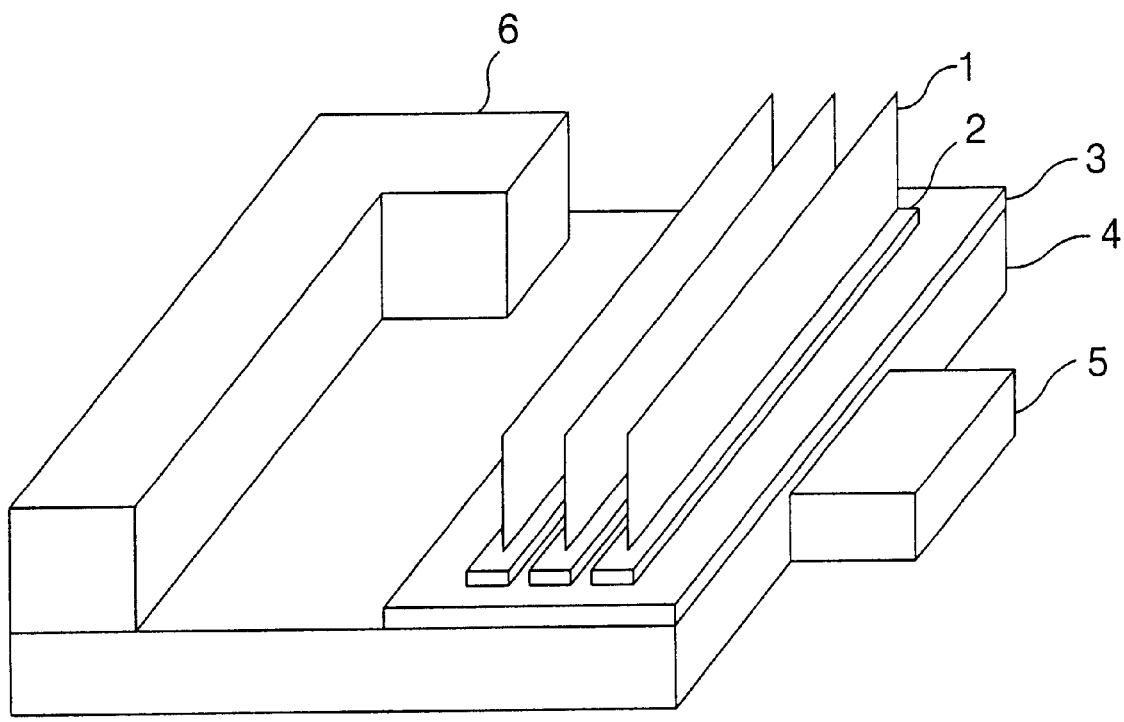
FIG. 1 is a perspective view showing the structure of a conventional module device testing apparatus.
Figure 2:
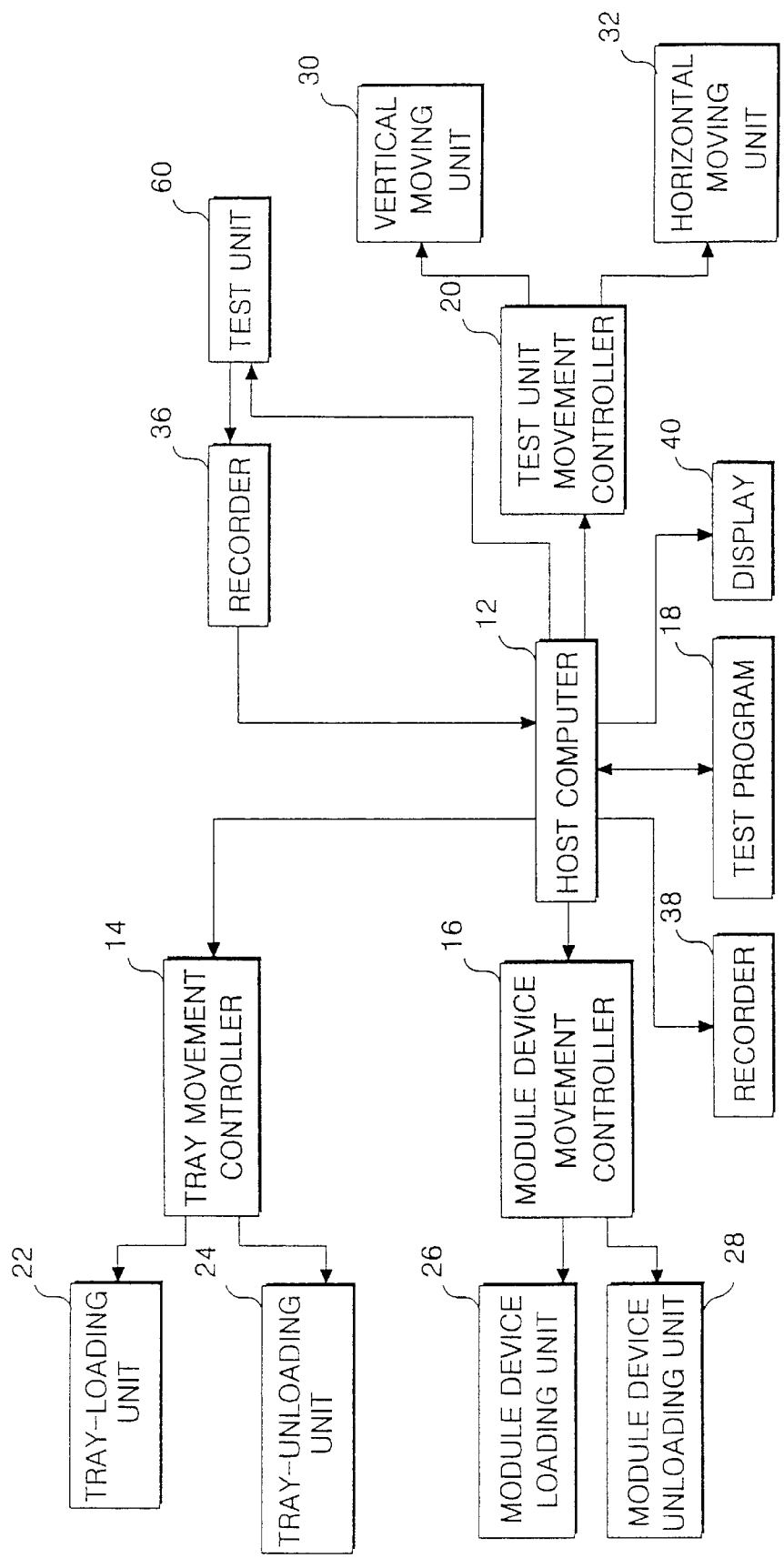
FIG. 2 is a block diagram showing the configuration of a module device testing apparatus according to an embodiment of the present invention.
Figure 3A:
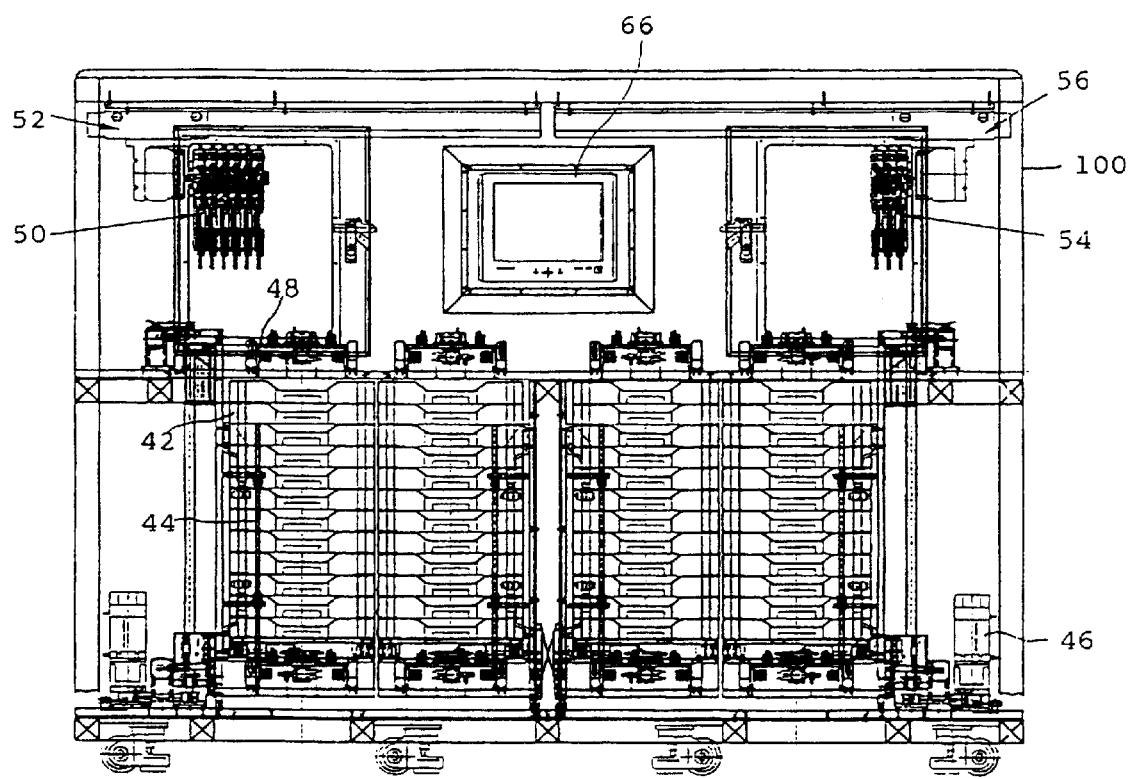
FIG. 3A is a detailed front view of the module device testing apparatus shown in FIG. 2.
Figure 3B:
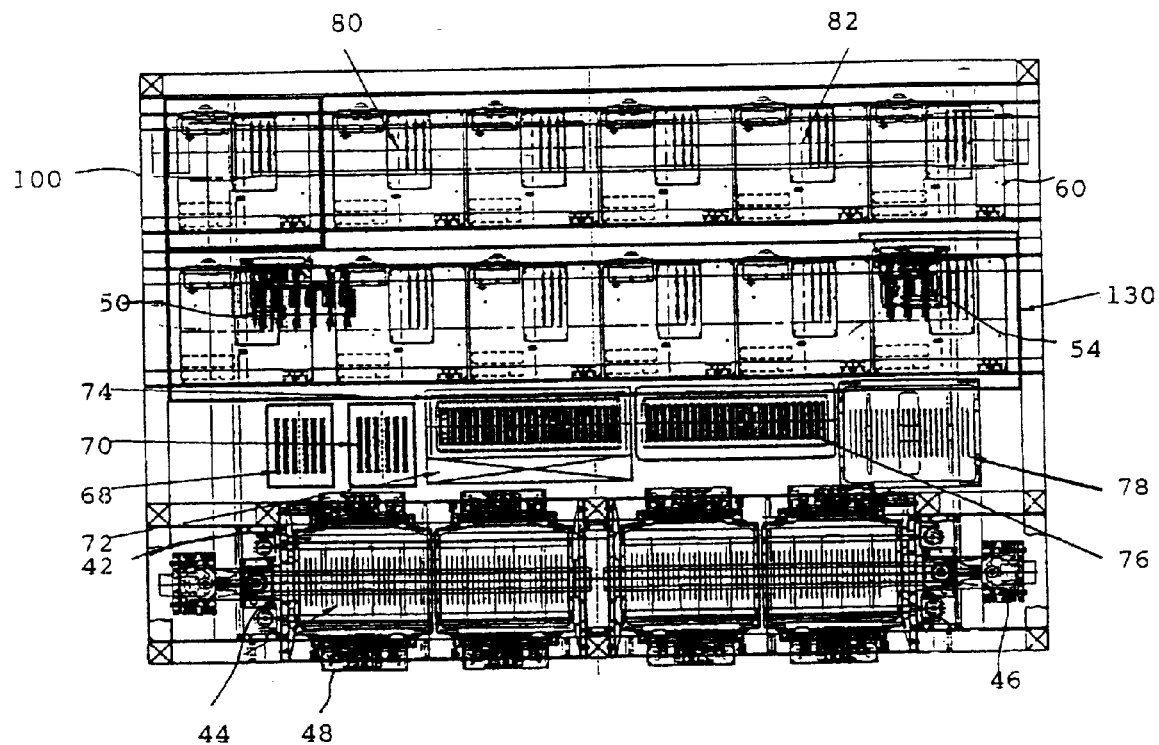
FIG. 3B is a detailed plan view of the module device testing apparatus shown in FIG. 2.
Figure 3C:
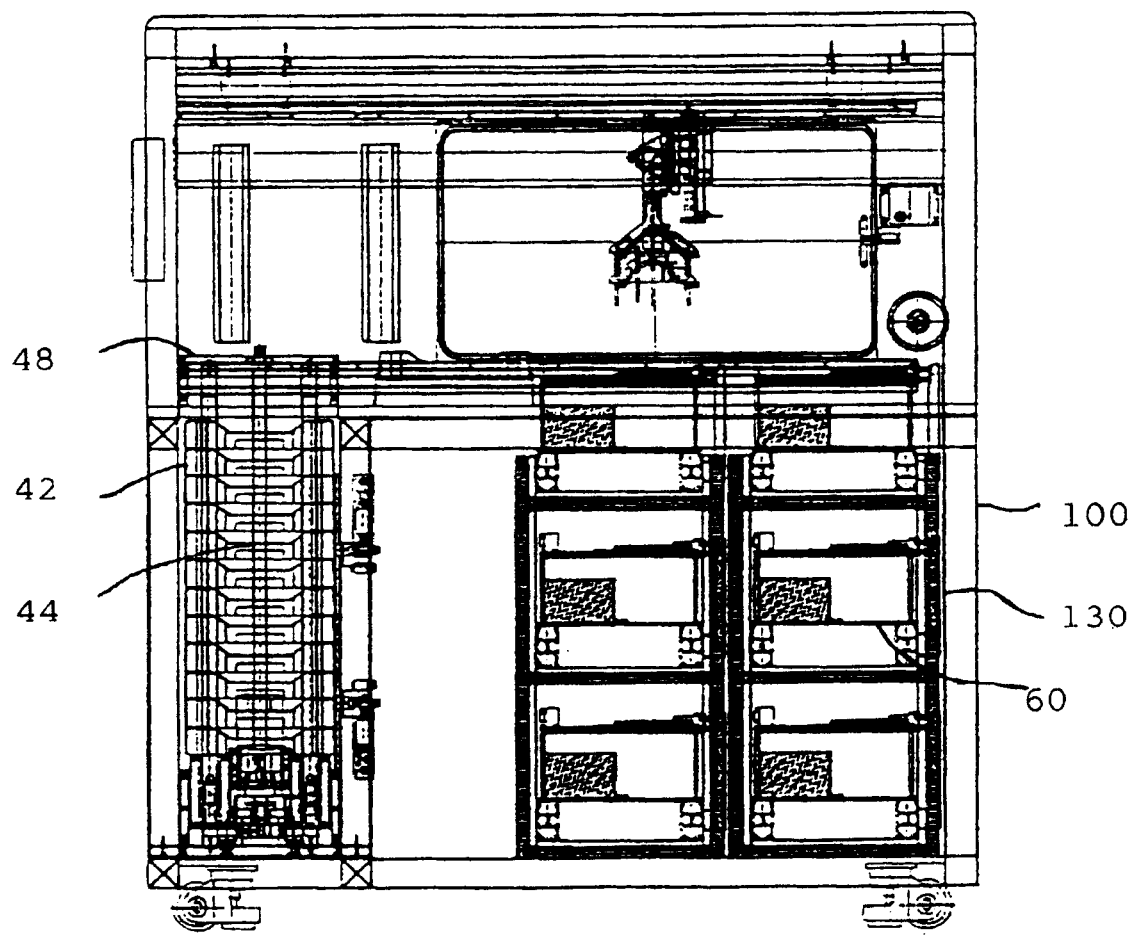
FIG. 3C is a detailed side view of the module device testing apparatus shown in FIG. 2.

Referring to FIG. 2 and FIGS. 3A to 3C, there is a module device testing apparatus according to an embodiment of the present invention. The module device testing apparatus includes a tray movement controller 14, a module device movement controller 16 and a test unit movement controller 20 that are controlled by means of a host computer 12, a reader 36 for supplying the host computer 12 with a test progress information and a test result information, a recorder 38 for recording the test result information to chips in module devices 1, and a display 40 for displaying a data supplied from the host computer 12. A test program programmed depending on the manufacturing company and model of the module devices 1 is loaded into the host computer 12. This host computer 12 executes the test program to control the tray movement controller 14, the module device movement controller 16 and the test unit movement controller 20 in accordance with a control sequence of the test program. Also, the host computer 12 generates an identification information for identifying the module devices 1 being moved within a high-temperature tunnel 13 installed within a set housing 100 and a control signal for controlling the test unit 60 and transmits them to the test unit 60. Within the set housing 100 are installed a tray loading unit 22, a tray unloading unit 24, a module device loading unit 26, a module device unloading unit 28, a vertical moving unit 30 and a horizontal moving unit 32 driven under control of the tray movement controller 14, the module device movement controller 16 and the test unit movement controller 20. The reader 36 transmits the test result information according to the module devices 1 inputted from each test unit 60 to the host computer 12 at a real time. The recorder 38 records the test result information from the host computer 12 to the chips within the module devices 1 mounted to check zones 68. The display 40 displays a data such as a test progress information, a test result information and an operation information of the testing apparatus, etc. supplied from the host computer 12. The display 40 is implemented with a cathode ray tube (CRT) or a liquid crystal display (LCD) installed at the front upper portion of the set housing 100 so that it can be easily watched by an operator.

The tray movement controller 14 controls the tray-loading unit 22 to load a tray 42 mounted with the untested module devices 1. In this case, several to tens of module devices 1 are mounted, in parallel, to the tray 42. Also, the tray movement controller 14 controls the tray unloading unit 24 to unload the tray 42 mounted with the module devices having completed the test. The tray loading unit 22 and the tray unloading unit 24 are implemented with an elevator 44 for being driven with a motor 46 to vertically raise or drop the tray 42 within the set housing 100. Tray fixing devices 48 are included in the tray-loading unit 22 and the tray-unloading unit 24. The tray-fixing device 48 is responsible for fixing the tray 42 by pressing both sides of the tray 42 at a loading position of tray and an unloading position of tray.

The module device movement controller 16 controls the module device loading unit 26 to mount the module devices 1 within the tray 42 loaded by means of the tray loading unit 22 to the socket in a buffer zone 70 for each desired number and, simultaneously, moves the module devices 1 within the buffer zone 70 into a loading zone 80 for each desired number. The buffer zone 70 plays a role to buffer a speed at which the module devices 1 within the tray 42 is moved into the loading zone 80. To this end, the module devices 1 within the tray 42 are moved into the buffer zone 70 for each six number, and the module devices 1 within the buffer zone 70 are moved into the loading zone 80 for each three number. Further, the module device movement controller 16 controls the module device unloading unit 28 to move the module devices 1 positioned at the unloading zone 82 into any one of the tray 42, a reject tray 78, a re-test tray 76, a heat shock chamber 74 and a check zone 68. The module device loading unit 26 is implemented with a loading head 50 and loading robot 52 installed within the set housing 100. Likewise, the module device unloading unit 28 is implemented with an unloading head 54 and an unloading robot 56 installed within the set housing 100. The loading head 50 includes six grippers that are driven with an air cylinder to grasp and release the module devices 1, while the unloading head 54 includes three grippers. The loading robot 52 and the unloading robot 56 play a role to move the loading head 50 and the unloading head 52, respectively, in the direction of X axis and Y axis perpendicular to each other.

The test unit movement controller 20 plays a role to drive the vertical moving unit 30 and the horizontal moving unit 32 to move the test unit 60 at the same layer or between the layers of the multiple-layer high-temperature tunnel 130 installed within the set housing 100. The vertical moving unit 30 consists of an elevator 44 installed within the set housing 100 to move the tray unit 60 between the layers. The horizontal moving unit 32 consists of a conveyer belt 11 installed for each layer of the high-temperature tunnel 130 to move the test unit 60 horizontally on the same layer. The conveyor belt 11 is installed at both ends of the test unit 60, and allows the test unit 60 to be moved in the horizontal direction.

Figure 4A:
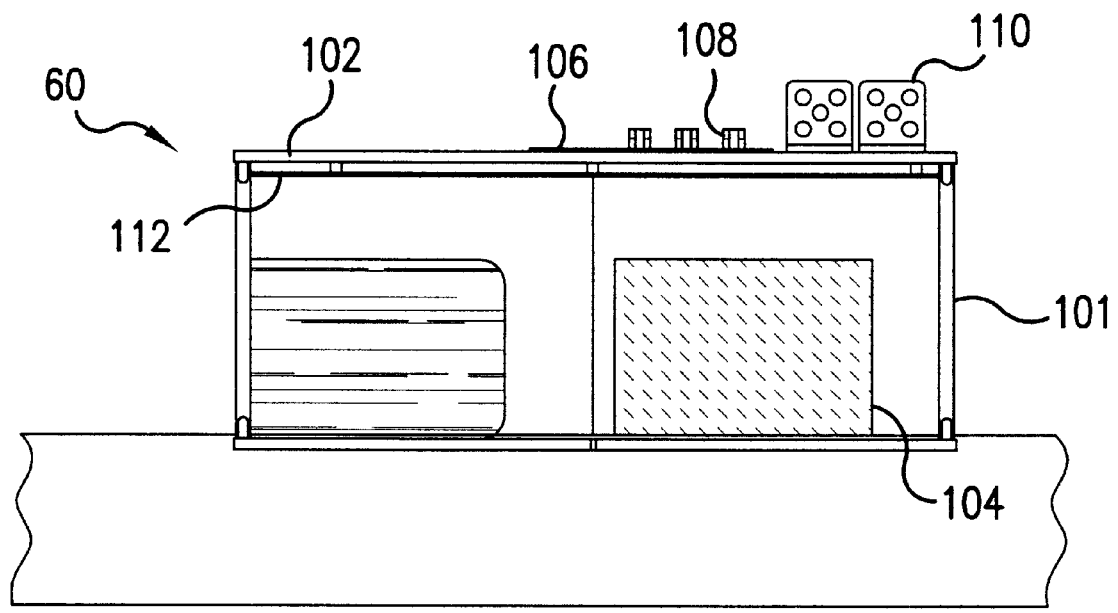
FIG. 4A is a detailed front view of the test unit shown in FIG. 2.
Figure 4B:
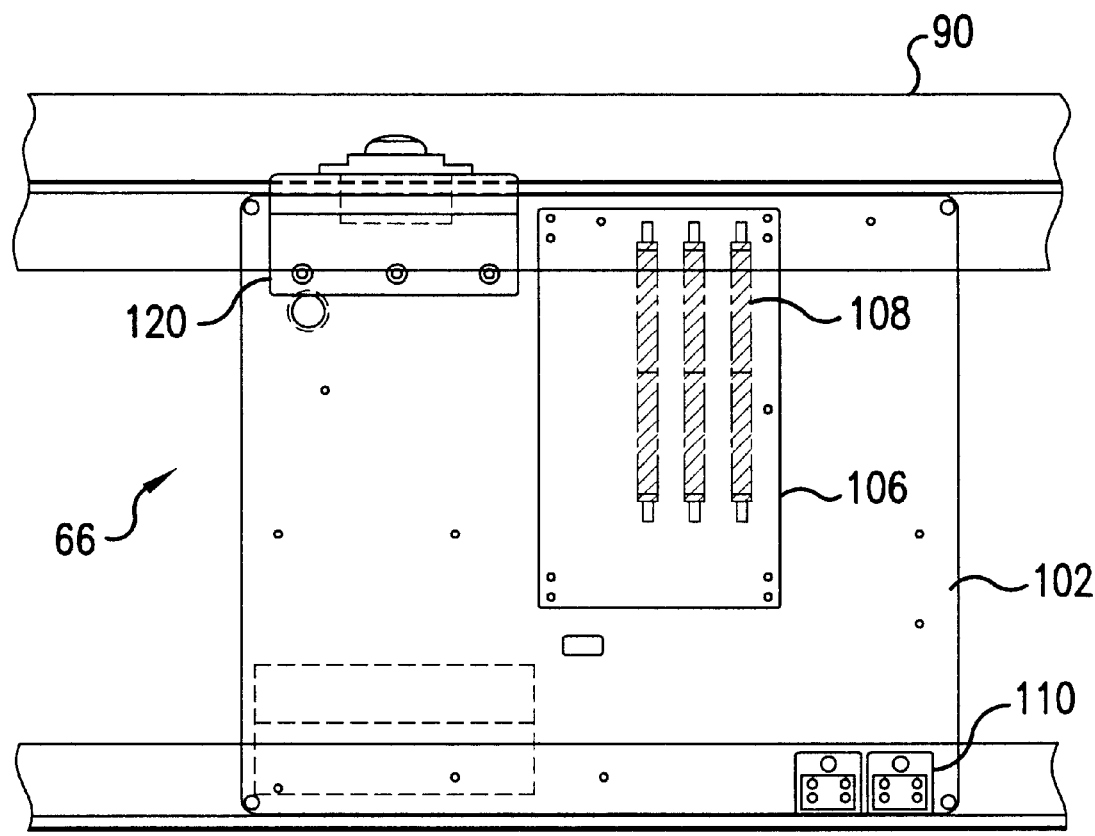
FIG. 4B is a detailed plan view of the test unit shown in FIG. 2.

Referring now to FIGS. 4A to 4C, the test unit 60 includes a base plate 102 mounted with a socket board 106, a test unit housing 101 provided with the base plate 102, a main board 112 and a direct current (DC) tester 104 that are installed within the test unit housing 101, and an electric power supply 120 and an identification information port 110 that are installed on the base plate 102. A number of sockets 108 mounted with the module devices 1 are installed on the socket board 106. Input/output pins of the socket board 106 goes through the base plate 102 to be connected to a connector of the main board 112. The main board 112 receives a supply voltage from the electric power supply 120 and a test signal from the DC tester 104. The test signal inputted from the DC tester 104 is applied, via the main board 112, to each module device 1 mounted to the socket board 106. The DC tester 104 generates a test signal and analyzes a signal transmitted from the main board 112 to determine an open-circuit state or a short-circuit state of the module devices 1. Also, the DC tester 104 determines current/voltage characteristics and power consumption characteristics of the module devices 1. Test result information of the module devices 1 determined by means of the DC tester 104 is transmitted, via the reader 36, to the host computer 12 and then is transmitted to the recorder 38 under control of the host computer 12. Having been determined to be of good quality, the test result information transmitted to the recorder 38 is supplied to the check zone 68 to be recorded to the module devices 1. The power supply 120 is continuously connected to a contact 124 of an L-shaped block 90 within the high-temperature tunnel 130 so that a supply voltage can be always applied to the main board 112. To this end, the power supply 120 is provided with a connector 122 connected to the contact 124. The connector 122 is connected to the contact 124 with the aid of an elastic force of an elastic member (not shown). The L-shaped block 90 is continuously installed for each layer in the high temperature tunnel 130 within the set housing 100. The identification information port 110 input s an identification information from the host computer and, if it is determined that the input identification information is right, it transmits the test result information from the DC tester 104 to the reader 36. Such a test unit 60 is horizontally moved on the same layer of the high-temperature tunnel 130 by means of a belt (not shown) wound around a belt housing 92 and is vertically moved between the layers by means of an elevator (not shown).

Figure 5:
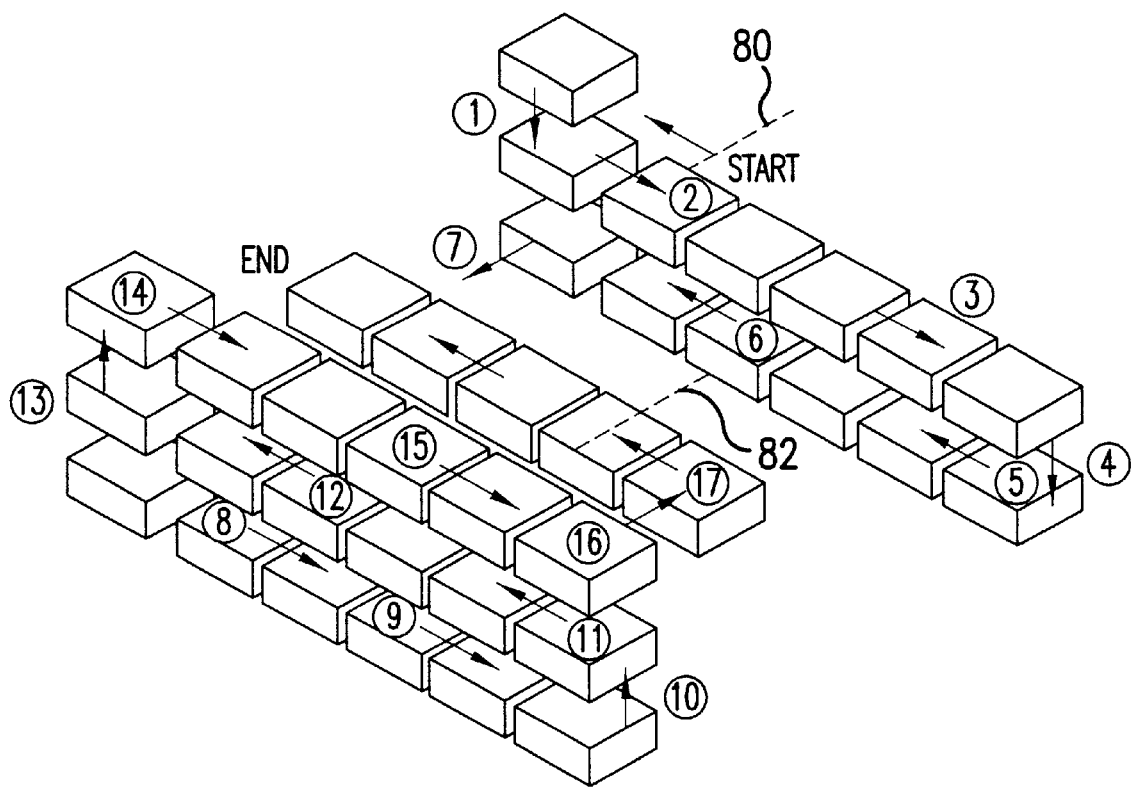
FIG. 5 is a perspective view for stepwise indicating a movement of the test unit at a high temperature channel shown in FIGS. 3A to 3C.

Hereinafter, an operation of the module device testing apparatus according to an embodiment of the present invention will be described. First, the module devices 1 within the tray 42 are moved into the buffer zone 70 for each six number by means of the loading head 50 and then are mounted to the sockets of the buffer zone 70. The six module devices 1 mounted to the buffer zone 70 are mounted to the sockets 108 of the test unit 60 located at the loading zone 80 for each three number. The test unit 60 mounted with the module devices 1 in this manner is horizontally moved into the "1" position as shown in FIG. 5 and, thereafter, goes down, vertically, by one layer by means of the elevator to enter the high-temperature tunnel 130. The test unit 60 having entered the high temperature tunnel 130 is horizontally moved into the "2" position and, thereafter, is horizontally moved into the "3" and "4" positions. The test unit 60 goes vertically down by one layer again from the "4" position and, thereafter, is horizontally moved into the "5" position, the "6" position and the "7" position sequentially. The test unit 60 is perpendicularly moved from the "7" position into the "8" position on the same layer and, thereafter is perpendicularly moved into the "8" position on the same layer again. The test unit 60 is horizontally moved from the "8" position into the "9" position and the "10" position sequentially and, thereafter, goes up vertically from the "10" position to arrive at the "11" position. The test unit 60 is horizontally moved from the "11" position into the "12" position and the "13" position sequentially and, thereafter, goes up vertically from the "13" position to arrive at the "14" position. The test unit 60 having arrived at the "14" position is horizontally moved into the "15" position and "16" position and, thereafter, is perpendicularly moved from the "16" position into the "17" position on the same layer. The test unit 60 is horizontally moved from the "17" position into the unloading zone 82. The test unit 60 moved between the layers in the high temperature tunnel 130 in this manner is subject to a test such as poor pattern, voltage/current characteristic, power consumption, etc., while a temperature being increased due to a hot air within the high-temperature tunnel 130. A poor pattern information, a voltage/current value and a power consumption value detected during the test is transmitted, via the identification information port 110, to the reader 36 at a real time. At the unloading zone 82, the test unit 60 transmits a test result information, via the identification information port 110, to the reader 36. The module devices 1 mounted to the test unit 60 in the unloading zone 82 are moved toward any one of the tray 42, the reject tray 78, the re-test tray 76, the heat shock chamber 74 and the check zone 68 depending on the test result with the aid of the unloading head 54. The module devices 1 in which an information such as producer, production date and test characteristic result, etc. is recorded by means of the recorder 38 at the check zone 68, are mounted to the unloaded tray 42. The module devices 1 determined to have finally a poor quality are mounted to the reject tray 78. The module devices 1 determined to have a poor quality as a result of the first test are mounted to the re-test tray 76. The module devices 1 mounted to the re-test tray 76 are again tested. To the heat shock chamber 74 are mounted the module devices 1 which are subject to the characteristic test at a higher temperature (i.e., 80 to 100° C.) than a temperature (i.e., about 60° C.) of the high-temperature tunnel 130 within the set housing 100 at a producer's request or in accordance with a model of the module device. To this end, a blower 72 for supplying hot air to the chamber is installed within the heat shock chamber 74. The module devices 1, which are finally determined to have a good quality, are mounted to the check zone 68. The check zone 68 receives a test result information and a producer information of the module device, etc. from the recorder 38 and records them to the module device under control of the recorder 38.

As described above, the module device testing apparatus and method according to the present invention progresses a test within the high-temperature tunnel with at least two layers, so that it can perform a simultaneous test for a large number of module devices. Also, it can perform a test by means of the DC tester executing a test program programmed for each model to carry out a test in accordance with the test program without using an expensive test control box in the prior art. In addition, the module device testing apparatus and method according to the present invention can separately and automatically treat module devices to be tested, module devices to be tested at a higher temperature than the high-temperature tunnel, module devices determined to have a good quality, module devices which are primarily determined to have a poor quality and module devices which are finally determined to have a poor quality in accordance with a test result within a single set housing.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An apparatus for testing module devices, comprising:
a plurality of test units mounted with a plurality of module devices;
a high-temperature tunnel with at least two layers;
movement means, provided within the high-temperature tunnel, for moving the test units at the same layer and between layers within the high-temperature tunnel, such that the test units can be moved vertically up or down between the layers, and the test units can be moved horizontally within the layers;
test means for testing an electrical characteristic of the module devices progressing within the high-temperature tunnel;
control means for controlling the movement means within the high-temperature tunnel and generating an identification information and a control signal for the test units;
reading means for supplying the control means with a test result information of the module devices from the test means; and
recording means for recording a producer information, the identification information and the test result information of the module devices to the module devices.

2. The apparatus according to claim 1, wherein said test means is installed within the test unit.

3. The apparatus according to claim 2, wherein said test unit comprises:
a socket board provided with sockets mounted with the module devices;

a base plate mounted with the socket board;

a main board connected, via the base plate, to the socket board to apply a test signal from the test means to the module devices;

a connector for applying a supply voltage to the main board with the high-temperature tunnel; and a port for receiving an identification information for the module devices to supply the reading means with the test result information.

4. The apparatus according to claim 3, further comprising:

a set housing, being provided with the high-temperature tunnel and the movement means within the high-temperature tunnel and connected to the connector, for applying a supply voltage at the main board.

5. The apparatus according to claim 1, wherein said movement means within the high-temperature tunnel comprises:

a conveyer belt for horizontally moving the test units at the same layer within the high-temperature tunnel; and an elevator for vertically moving the test units between the layers within the high-temperature tunnel.

6. An apparatus for testing module devices, comprising:

a plurality of test units mounted with a plurality of module devices and provided with a tester for testing an electrical characteristic of the module devices;

a high-temperature tunnel with at least two layers;

movement means, provided within the high-temperature tunnel, for moving the test units at the same layer and between layers within the high-temperature tunnel, such that the test units can be moved vertically up or down between the layers, and the test units can be moved horizontally within the layers;

module device loading means for locating the module devices at a loading position of the high-temperature tunnel;

module device unloading means for deriving the module devices located at the loading position of the high-temperature tunnel;

control means for controlling the movement means within the high-temperature tunnel, the module device loading means and the module device unloading means and for generating a control signal of the test units;

reading means for supplying the control means with a test result information from the test units; and recording means for recording a producer information of the module devices and the test result information to the module devices.

7. The apparatus according to claim 6, further comprising:

a load tray mounted with a desired number of module devices loaded into the high-temperature tunnel;

an unload tray mounted with a desired number of module devices unloaded from the high-temperature tunnel;

tray loading means for moving the load tray within an operation range of the module device loading means;

tray unloading means for deriving the unload tray into the exterior; and a buffer zone mounted temporarily with the module devices within the load tray with the aid of the module device loading means.

8. The apparatus according to claim 7, wherein said module device loading means consists of n grippers (wherein n is an even number larger than 2) for grasping each module device; and said module device unloading means n/2 grippers (wherein n is an even number larger than 2) for grasping each module device.

9. The apparatus according to claim 7, further comprising:

a set housing for applying a supply voltage to the test units, said set housing being provided with the high-temperature tunnel, the movement means within the high-temperature tunnel, the module device loading means, the module device unloading means, the tray loading means, the tray unloading means and the buffer zone.

10. The apparatus according to claim 7, wherein the module devices determined to have a good quality are mounted to the unload tray.

11. The apparatus according to claim 7, further comprising:

a reject tray mounted with the module devices determined finally to have a poor quality as a result of the test, said reject tray being installed within the set housing;

a re-test tray mounted with the module devices determined to have a poor quality as a result of the first test, said re-test tray being installed within the set housing; and a hot shock chamber for testing the module devices at a higher temperature than the high-temperature tunnel at a producer's request and in accordance with a model of the module device, said hot shock chamber being installed within the set housing.

12. The apparatus according to claim 11, wherein a temperature of said high-temperature tunnel is about 60° C.; and a temperature of said hot shock chamber is about 80 to 100° C.

* * * * *